US009209822B2

(12) United States Patent
Teh et al.

(10) Patent No.: US 9,209,822 B2
(45) Date of Patent: Dec. 8, 2015

(54) A/D CONVERTER AND SEMICONDUCTOR INTEGRATED CIRCUIT

(71) Applicant: Kabushiki Kaisha Toshiba, Minato-ku, Tokyo (JP)

(72) Inventors: Chen Kong Teh, Ota Tokyo (JP); Atsushi Suzuki, Yokohama Kanagawa (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 14/466,399

(22) Filed: Aug. 22, 2014

(65) Prior Publication Data

US 2015/0115925 A1    Apr. 30, 2015

(30) Foreign Application Priority Data

Oct. 25, 2013  (JP) .................................. 2013-222135

(51) Int. Cl.
| | |
|---|---|
| H03M 1/12 | (2006.01) |
| H03M 1/00 | (2006.01) |
| G04F 10/00 | (2006.01) |
| H02M 3/157 | (2006.01) |

(52) U.S. Cl.
CPC ............. *H03M 1/002* (2013.01); *G04F 10/005* (2013.01); *H03M 1/12* (2013.01); *H02M 3/157* (2013.01)

(58) Field of Classification Search
CPC ....... G04F 10/005; H02M 3/157; H03M 1/12; H03M 1/002
See application file for complete search history.

(56) References Cited

U.S. PATENT DOCUMENTS

| | | | | |
|---|---|---|---|---|
| 5,694,377 | A | * | 12/1997 | Kushnick ....................... 368/120 |
| 7,330,144 | B2 | * | 2/2008 | Terazawa et al. ............. 341/157 |
| 7,525,471 | B2 | | 4/2009 | Prodie et al. |
| 7,595,686 | B2 | | 9/2009 | Maksimovic et al. |
| 7,688,126 | B2 | * | 3/2010 | Henzler et al. ................ 327/261 |
| 8,098,085 | B2 | * | 1/2012 | Wang et al. ........................ 327/8 |
| 8,164,318 | B2 | | 4/2012 | Sasaki et al. |

FOREIGN PATENT DOCUMENTS

| | | |
|---|---|---|
| JP | 2005-512493 A | 4/2005 |
| JP | 2010-520669 A | 6/2010 |
| JP | 2011-062057 A | 3/2011 |
| WO | 03/050637 A2 | 6/2003 |
| WO | 2008/106458 A1 | 9/2008 |

OTHER PUBLICATIONS

Benjamin J. Patella, et al. "High-Frequency Digital PWM Controller IC for DC-DC Converters" IEEE Transactions on Power Electronics, vol. 18, pp. 438-446 (2003).

* cited by examiner

*Primary Examiner* — Brian Young
(74) *Attorney, Agent, or Firm* — White & Case LLP

(57) ABSTRACT

According to one embodiment, an A/D converter includes a first delay cell column in which a plurality of delay cells, to which a first bias current corresponding to a difference voltage between an input voltage and a reference voltage is supplied, is connected in series. The converter includes a second delay cell column in which a plurality of delay cells, to which a second bias current corresponding to a negative-phase difference voltage of the difference voltage is supplied, is connected in series. The converter includes an encoder unit configured to encode a difference value, in delay time of signal propagation, between the first delay cell column and the second delay cell column.

20 Claims, 10 Drawing Sheets

(i) reset (ii) trig (iii) P (iv) M

A/D CONVERTER AND SEMICONDUCTOR INTEGRATED CIRCUIT

CROSS-REFERENCE TO RELATED APPLICATIONS

This application is based upon and claims the benefit of priority from Japanese Patent Application No. 2013-222135, filed on Oct. 25, 2013; the entire contents of which are incorporated herein by reference.

FIELD

Embodiments described herein relate generally to an A/D converter and a semiconductor integrated circuit including the A/D converter.

BACKGROUND

Conventionally, an A/D converter using delay time, which changes depending on an operating voltage or an operating current, of a delay cell and a technique to use the A/D converter to control an output voltage of a power supply circuit have been disclosed. A delay line A/D converter using a delay cell is preferable for reducing power consumption.

For example, a configuration to detect a difference between delay time of signal propagation of a delay cell column biased by an input voltage to be A/D converted and delay time of signal propagation of a delay cell column biased by a reference voltage and to obtain a digital output has been disclosed. However, delay time of a delay cell also changes, for example, due to temperature. Due to a change in delay time of a delay cell in a delay line A/D converter, an output on a side of a delay cell column, which is to be a reference, varies. Thus, a digital output signal varies according to the change in temperature. For example, when an A/D converter is used to control an output voltage of a power supply circuit, there is a problem in that the output voltage of the power supply circuit varies in response to a variation in an output signal of the A/D converter.

DETAILED DESCRIPTION

In general, according to one embodiment, an A/D converter includes a first delay cell column in which a plurality of delay cells, to which a first bias current corresponding to a difference voltage between an input voltage and a reference voltage is supplied, is connected in series. The converter includes a second delay cell column in which a plurality of delay cells, to which a second bias current corresponding to a negative-phase difference voltage of the difference voltage is supplied, is connected in series. The converter includes an encoder unit configured to encode a difference value, in delay time of signal propagation, between the first delay cell column and the second delay cell column.

Exemplary embodiments of an A/D converter and a semiconductor integrated circuit including the A/D converter will be explained below in detail with reference to the accompanying drawings. The present invention is not limited to the following embodiments.

First Embodiment

Figure 1:
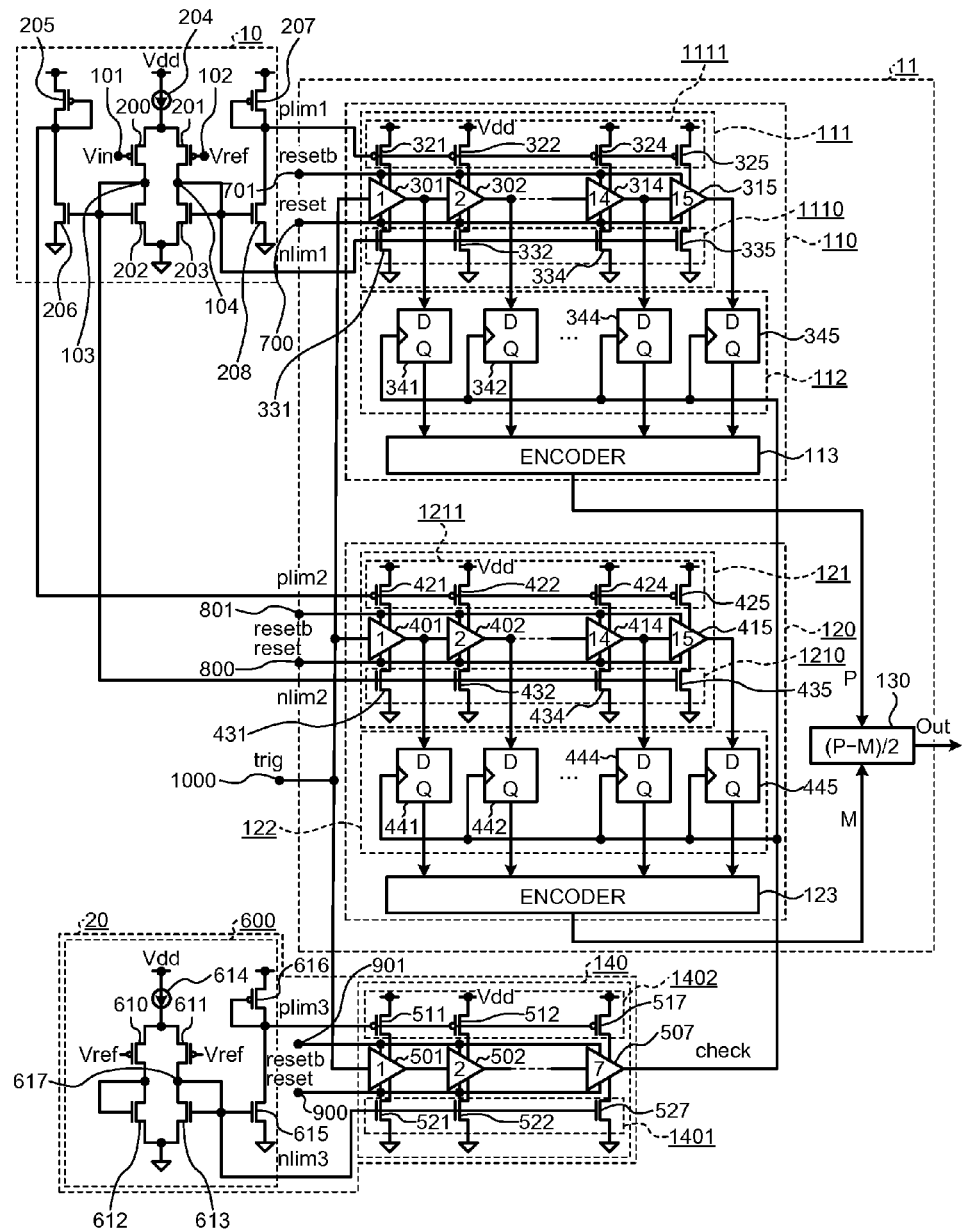
FIG. 1 is a view illustrating an A/D converter of a first embodiment.

FIG. 1 is a view illustrating an A/D converter of a first embodiment. In the present embodiment, a first differential amplifier circuit 10 is included. To a first input terminal 101 of the first differential amplifier circuit 10, an input voltage Vin is applied. To a second input terminal 102 of the first differential amplifier circuit 10, a reference voltage Vref is applied. To the first input terminal 101, a gate electrode of a PMOS transistor 200 which configures a differential pair is connected. A source electrode of the PMOS transistor 200 is connected to a current source 204, and a drain electrode of the PMOS transistor 200 is connected to a negative-phase output terminal 103. To the second input terminal 102, a gate electrode of a PMOS transistor 201 which configures the differential pair is connected. A source electrode of the PMOS transistor 201 is connected to the current source 204, and a drain electrode of the PMOS transistor 201 is connected to a positive-phase output terminal 104. To the other end side of the current source 204, a power supply voltage Vdd is applied. Here, a "negative-phase" means that there is a relationship in which when an output of one side increases, an output of the other side decreases.

A source-drain path of an NMOS transistor 203 is connected in series with a source-drain path of the PMOS transistor 201. A drain electrode of the NMOS transistor 203 is connected to the drain electrode of the PMOS transistor 201, and a source electrode of the NMOS transistor 203 is grounded. Also, a gate electrode of the NMOS transistor 203 is connected to the positive-phase output terminal 104.

A source-drain path of an NMOS transistor 202 is connected in series with a source-drain path of the PMOS transistor 200. A drain electrode of the NMOS transistor 202 is connected to the drain electrode of the PMOS transistor 200, and a source electrode of the NMOS transistor 202 is grounded. Also, a gate electrode of the NMOS transistor 202 is connected to the negative-phase output terminal 103.

To the gate electrode of the NMOS transistor 203, a gate electrode of an NMOS transistor 208 is connected. A source electrode of the NMOS transistor 208 is grounded, and a drain electrode of the NMOS transistor 208 is connected to a drain electrode of a PMOS transistor 207.

To the gate electrode of the NMOS transistor 202, a gate electrode of an NMOS transistor 206 is connected. A source electrode of the NMOS transistor 206 is grounded, and a drain electrode of the NMOS transistor 206 is connected to a drain electrode of a PMOS transistor 205.

An output voltage corresponding to a result of comparison between the input voltage Vin and the reference voltage Vref, which are applied to the first differential amplifier circuit 10, is output from each of the negative-phase output terminal 103 and the positive-phase output terminal 104. When the input voltage Vin is higher than the reference voltage Vref, an output voltage of the positive-phase output terminal 104 increases. Inversely, when the input voltage Vin is lower than the reference voltage Vref, an output voltage of the negative-phase output terminal 103 increases. That is, the output voltage of the positive-phase output terminal 104 increases corresponding to a first difference voltage (Vin−Vref) between the input voltage Vin and the reference voltage Vref. The output voltage of the negative-phase output terminal 103 increases corresponding to a second difference voltage (Vref−Vin) which is in a negative-phase relationship with the first difference voltage (Vin−Vref).

In the present embodiment, a digital processing circuit 11 is included. The digital processing circuit 11 includes a first delay line circuit 110 and a second delay line circuit 120. The first delay line circuit 110 includes a first delay cell column 111 and a first flip-flop circuit column 112. The second delay line circuit 120 includes a second delay cell column 121 and a second flip-flop circuit column 122.

The first delay cell column 111 includes, for example, 15 delay cells (301, 302, 314, and 315) connected in series, a first transistor group 1110, and a second transistor group 1111. Each of the first transistor group 1110 and the second transistor group 1111 supplies a bias current to each of the delay cells. The number of delay cells in the delay cell column 111 is set according to the number of bits of a digital output signal Out to be output. In the present embodiment, since a four-bit digital output signal Out is output, the number of delay cells is set to 15.

The number of transistors included in the first transistor group 1110 corresponds to the number of delay cells in the first delay cell column 111. In the present embodiment, the first transistor group 1110 includes 15 NMOS transistors (331, 332, 334, and 335), gate electrodes of which are connected in common. The gate electrode of each of the NMOS transistors in the first transistor group 1110 is connected to the gate electrode of the NMOS transistor 203. With this configuration, the NMOS transistor 203 and each of the NMOS transistors in the first transistor group 1110 configure a current mirror circuit. Since the gate electrode of the NMOS transistor 203 is biased by a voltage of the positive-phase output terminal 104, the NMOS transistors in the first transistor group 1110 supply a bias current corresponding to the first difference voltage (Vin−Vref) to the delay cells (301, 302, 314, and 315) in the first delay cell column 111, respectively.

The first delay cell column 111 includes the second transistor group 1111. The number of transistors included in the second transistor group 1111 also corresponds to the number of delay cells in the first delay cell column 111. Thus, in the present embodiment, the second transistor group 1111 includes 15 PMOS transistors (321, 322, 324, and 325), gate electrodes of which are connected in common. The gate electrode of each of the PMOS transistors in the second transistor group 1111 is connected to the gate electrode of the PMOS transistor 207. With this configuration, the PMOS transistor 207 and each of the PMOS transistors in the second transistor group 1111 configure a current mirror circuit. A current equal to a drain current of the NMOS transistor 208 flows through the PMOS transistor 207. The NMOS transistor 208 and the NMOS transistor 203 configure a current mirror circuit. Thus, the PMOS transistors in the second transistor group 1111 also supply the bias current corresponding to the first difference voltage (Vin−Vref) to the delay cells in the first delay cell column 111, respectively. Both of the NMOS transistors in the first transistor group 1110 and the PMOS transistors in the second transistor group 1111 respectively supply, to the delay cells in the first delay cell column 111, the bias current corresponding to the first difference voltage (Vin−Vref). Thus, sensitivity of each of the delay cells to the first difference voltage (Vin−Vref) can be enhanced. A trigger signal trig supplied to an input end 1000 is supplied to a first delay cell 301 in the first delay cell column 111. Propagation delay of the trigger signal trig by the first delay cell column 111 is detected by the first delay line circuit 110.

The first delay line circuit 110 includes the first flip-flop circuit column 112. The first flip-flop circuit column 112 includes flip-flop circuits (341, 342, 344, and 345), the number of which is equal to the number of delay cells in the first delay cell column 111. An output from each of the delay cells in the first delay cell column 111 is supplied to a corresponding flip-flop circuit.

The first delay line circuit 110 includes a first encoder 113. The first encoder 113 encodes an output signal from the first flip-flop circuit column 112 and outputs a first output signal P.

The first delay line circuit 110 includes a terminal 700 to which a first reset signal reset is supplied and a terminal 701 to which a second reset signal resetb is supplied. The second reset signal resetb is an inversion signal of the first reset signal reset. By supplying the first reset signal reset and the second reset signal resetb to each of the delay cells in the first delay cell column 111, an output of each of the delay cells is reset and becomes a Low level.

The second delay line circuit 120 basically includes a configuration similar to that of the first delay line circuit 110. That is, the second delay line circuit 120 includes the second delay cell column 121, the second flip-flop circuit column 122, and a second encoder 123.

The second delay line circuit 120 includes a terminal 800 to which a first reset signal reset is supplied and a terminal 801 to which a second reset signal resetb is supplied. The second delay cell column 121 in the second delay line circuit 120 includes delay cells (401, 402, 414, and 415), the number of which is the same as the number of delay cells in the first delay line circuit 110. To the delay cells in the second delay cell column 121, NMOS transistors (431, 432, 434, and 435) in a third transistor group 1210 and PMOS transistors (421, 422, 424, and 425) in a fourth transistor group 1211 respectively supply, as a bias current, a current corresponding to the second difference voltage (Vref−Vin) in the negative-phase. Thus, delay time of the second delay line circuit 120 changes according to the second difference voltage (Vref−Vin) in the negative-phase. A trigger signal trig supplied to the input end 1000 is supplied to a first delay cell 401 in the second delay cell column 121. Propagation delay of the trigger signal trig by the second delay cell column 121 is detected by the second delay line circuit 120.

Outputs from the delay cells (401, 402, 414, and 415) in the second delay cell column 121 are respectively supplied to corresponding flip-flop circuits (441, 442, 444, and 445) in the second flip-flop circuit column 122. The second encoder 123 encodes an output signal from the second flip-flop circuit column 122 and outputs a second output signal M.

The output signal P of the first delay line circuit 110 and the output signal M of the second delay line circuit 120 are supplied to an operation circuit 130. The operation circuit 130 outputs a value which is ½ of a difference value between the output signal P and the output signal M, that is, a digital output signal (P−M)/2. The output signal P of the first delay line circuit 110 is an output indicating delay time corresponding to the first difference voltage (Vin−Vref). Also, the output signal M of the second delay line circuit 120 indicates delay time corresponding to the second difference voltage (Vref−

Vin) in the negative-phase. Thus, by calculating a value which is ½ of a difference value between both output signals, that is, ((Vin−Vref)−(Vref−Vin)), a digital signal output corresponding to the difference voltage (Vin−Vref) between the input voltage Vin and the reference voltage Vref can be obtained. The operation circuit 130 includes, for example, a subtraction circuit and a shifter circuit.

In the present embodiment, a detection signal generation circuit 20 to generate a detection signal check is included. The flip-flop circuits in the first flip-flop circuit column 112 in the first delay line circuit 110 and in the second flip-flop circuit column 122 in the second delay line circuit 120 respond to the detection signal check, and respectively take output signals of the delay cells in the first delay cell column 111 and the second delay cell column 121.

The detection signal generation circuit 20 includes a second differential amplifier circuit 600. The second differential amplifier circuit 600 includes PMOS transistors 610 and 611 which configure a differential pair. A source electrode of each of the PMOS transistors 610 and 611 is connected to a current source 614. A drain electrode of the PMOS transistor 610 is connected to a drain electrode and a gate electrode of an NMOS transistor 612. A drain electrode of the PMOS transistor 611 is connected to an output terminal 617, and a drain electrode and a gate electrode of an NMOS transistor 613. A source electrode of each of the NMOS transistors 612 and 613 is grounded.

To a gate electrode of the NMOS transistor 613, a gate electrode of an NMOS transistor 615 is connected. A source electrode of the NMOS transistor 615 is grounded. The NMOS transistors 613 and 615 configure a current mirror circuit. Thus, a drain current of the NMOS transistor 615 is equal to a drain current of the NMOS transistor 613. To the gate electrode of each of the PMOS transistors 610 and 611 which configure the differential pair, the reference voltage Vref is applied. Thus, ½ of a current of the current source 614 flows through the NMOS transistor 613. Therefore, the drain current of the NMOS transistor 615 which configures the current mirror circuit with the NMOS transistor 613 is also equal to ½ of the current value of the current source 614. A drain electrode of the NMOS transistor 615 is connected to a drain electrode and a gate electrode of a PMOS transistor 616. A drain current of the PMOS transistor 616 becomes equal to the drain current of the NMOS transistor 615, and thus, the drain current of the PMOS transistor 616 is also equal to ½ of the current value of the current source 614.

The detection signal generation circuit 20 includes a third delay cell column 140. The third delay cell column 140 includes a terminal 900 to which a first reset signal reset is supplied and a terminal 901 to which a second reset signal resetb is supplied. The third delay cell column 140 includes, for example, seven delay cells (501, 502, and 507) connected in series, a fifth transistor group 1401, and a sixth transistor group 1402. Each of the fifth transistor group 1401 and the sixth transistor group 1402 supplies a bias current to each of the delay cells. The number of transistors included in the fifth transistor group 1401 corresponds to the number of delay cells in the third delay cell column 140. In the present embodiment, the fifth transistor group 1401 includes seven NMOS transistors (521, 522, and 527), gate electrodes of which are connected in common. The gate electrode of each of the NMOS transistors in the fifth transistor group 1401 is connected to the gate electrode of the NMOS transistor 613, and the source electrode thereof is grounded. Thus, each of the NMOS transistors in the fifth transistor group 1401 configures a current mirror circuit with the NMOS transistor 613. Therefore, each of the NMOS transistors in the fifth transistor group 1401 supplies, as a bias current, a current equal to ½ of the current value of the current source 614 to each of the delay cells (501, 502, and 507) in the third delay cell column 140.

The third delay cell column 140 includes the sixth transistor group 1402. The number of transistors included in the sixth transistor group 1402 also corresponds to the number of delay cells in the third delay cell column 140. Thus, in the present embodiment, the sixth transistor group 1402 includes seven PMOS transistors (511, 512, and 517), gate electrodes of which are connected in common. The gate electrode of each of the PMOS transistors in the sixth transistor group 1402 is connected to the gate electrode of the PMOS transistor 616. With this configuration, the PMOS transistor 616 and each of the PMOS transistors in the sixth transistor group 1402 configure a current mirror circuit. A current equal to the drain current of the NMOS transistor 615, that is, a current equal to ½ of the current value of the current source 614, flows through the PMOS transistor 616. Thus, the drain electrodes of the PMOS transistors in the sixth transistor group 1402 respectively supply, to the delay cells in the third delay cell column 140, the current equal to ½ of the current value of the current source 614.

A current value of the current source 204 of the first differential amplifier circuit 10 and a current value of the current source 614 of the second differential amplifier circuit 600 are made equal to each other. Thus, a bias current, which is equal to a bias current supplied to the delay cells in the first delay cell column 111 and the second delay cell column 121, is supplied to each of the delay cells in the third delay cell column 140 in the detection signal generation circuit 20, when the input voltage Vin is equal to the reference voltage Vref, that is, when Vin=Vref. Thus, each of the delay cells (501, 502, and 507) in the detection signal generation circuit 20 includes delay time corresponding to the delay time of the delay cells in the first delay cell column 111 and the second delay cell column 121 in a case where the reference voltage Vref is applied. For example, when the delay time of the delay cells in the first delay cell column 111 and the second delay cell column 121 varies due to a change in temperature, delay time of the delay cells in the third delay cell column 140 in the detection signal generation circuit 20 also varies. Therefore, this variation in the delay time is canceled between the delay cells in the first delay cell column 111 and the second delay cell column 121 and the delay cells in the detection signal generation circuit 20. Thus, the detection signal generation circuit 20 can supply a detection signal check under a condition of the delay time in a case where the reference voltage Vref is applied as the input voltage Vin. The detection signal check controls timing for each of the flip-flop circuits in the first and second flip-flop circuit columns (112 and 122) to take a signal from each of the delay cells in the first and second delay cell columns (111 and 121). A configuration preferable for performing A/D conversion with the reference voltage Vref as reference is realized.

The number of delay cells in the third delay cell column 140 can be set arbitrarily according to detection timing. That is, the number of delay cells is set according to timing when a trigger signal trig propagating in each of the first delay cell column 111 and the second delay cell column 121 is detected. In the present embodiment, the trigger signal trig is detected at timing of a delay cell in the middle of each of the first delay cell column 111 and the second delay cell column 121, and thus, the number of delay cells in the third delay cell column 140 is seven, which corresponds to a half of the number of delay cells in each of the first delay cell column 111 and the second delay cell column 121.

A trigger signal trig supplied to the input end 1000 is supplied to a first delay cell 501 in the third delay cell column 140 in the detection signal generation circuit 20. After being delayed by the third delay cell column 140, the detection signal check is output from a delay cell 507 in the final stage and is supplied to each of the flip-flop circuits in the first flip-flop circuit column 112 and the second flip-flop circuit column 122. Each of the flip-flop circuits responds to the detection signal check and takes an output signal of a corresponding delay cell in the first delay cell column 111 and the second delay cell column 121.

A current I1 supplied to each of the delay cells in the first delay cell column 111 and a current I2 supplied to each of the delay cells in the second delay cell column 121, which are supplied by a voltage which appears in the output from the positive-phase output terminal 104 and the negative-phase output terminal 103 in the first differential amplifier circuit 10, can be expressed in the following formulas.

$$I1 = A \times (Vin - Vref) + I/2 \quad (1)$$

$$I2 = A \times (Vref - Vin) + I/2 \quad (2)$$

Here, I represents a current value of the current source 204 of the first differential amplifier circuit 10. A represents a gain. Since each of the delay cells includes a signal propagation speed corresponding to a supplied current value, signal propagation speed v1 of the delay cell in the first delay cell column 111 and signal propagation speed v2 of the delay cell in the second delay cell column 121 can be expressed in the following formulas.

$$v1 = B \times (Vin - Vref) + vo \quad (3)$$

$$v2 = B \times (Vref - Vin) + vo \quad (4)$$

Here, B represents a conversion coefficient to a signal propagation speed, and $vo$ represents a signal propagation speed with a current I/2. A difference in the signal propagation speeds is detected as a difference in delay time between the first delay line circuit 110 and the second delay line circuit 120.

In the first embodiment, a current value of the current source 614 of the second differential amplifier circuit 600, which configures the detection signal generation circuit 20, is made equal to a current value of the current source 204 of the first differential amplifier circuit 10. Thus, the delay cell of the third delay cell column 140, which configures the detection signal generation circuit 20, has the signal propagation speed $vo$ expressed in the formula (3) and the formula (4). Thus, by controlling timing for detection of the first delay line circuit 110 and the second delay line circuit 120 by the detection signal check which is an output signal of the detection signal generation circuit 20, influence of the signal propagation speed $vo$ is canceled.

When the input voltage Vin is higher than the reference voltage Vref, the signal propagation speed v1 of the delay cell in the first delay cell column 111 is higher than the signal propagation speed v2 of the delay cell in the second delay cell column 121. Thus, the output signal P of the first delay line circuit 110 is larger than the output signal M of the second delay line circuit 120. Therefore, by calculating a difference between the output signals of the first delay line circuit 110 and the second delay line circuit 120 by the operation circuit 130, an output signal corresponding to (B×(Vin−Vref)−B×(Vref−Vin))/2, that is, a positive output signal corresponding to B×(Vin−Vref), can be obtained. Inversely, when the input voltage Vin is lower than the reference voltage Vref, the signal propagation speed v2 of the delay cell in the second delay cell column 121 is higher than the signal propagation speed v1 of the delay cell in the first delay cell column 111. Thus, the output signal M of the second delay line circuit 120 is larger than the output signal P of the first delay line circuit 110. Therefore, by calculating a difference between the output signals of the first delay line circuit 110 and the second delay line circuit 120 by the operation circuit 130, a negative output signal corresponding to B×(Vref−Vin) can be obtained. In either case, an output signal based on comparing operation of the input voltage Vin with the reference voltage Vref as a reference can be obtained. That is, a center value is fixed to the reference voltage Vref.

Even when the signal propagation speed $vo$ expressed in the signal propagation speed v1 of the delay cell in the first delay cell column 111 and the signal propagation speed v2 of the delay cell in the second delay cell column 121, which are expressed in the formula (3) and the formula (4), varies due to a change in temperature, the signal propagation speed $vo$ of the delay cell in the third delay cell column 140 which configures the detection signal generation circuit 20 varies in a similar manner. Thus, by controlling the timing for detecting the first delay line circuit 110 and the second delay line circuit 120, with the detection signal check which is an output signal of the detection signal generation circuit 20, influence of the variation in the signal propagation speed $vo$ is canceled. When the conversion coefficient B to the signal propagation speed changes due to a change in temperature and becomes, for example, a conversion coefficient B1, an output signal corresponding to B1×(Vin−Vref) is obtained in a case where the input voltage Vin is higher than the reference voltage Vref. Inversely, in a case where the input voltage Vin is lower than the reference voltage Vref, a negative output signal corresponding to a difference in B1×(Vref−Vin) is obtained. That is, in either case, an output signal by the comparing operation of the input voltage Vin with the reference voltage Vref as reference is obtained. Thus, a center value of A/D conversion is fixed to the reference voltage Vref even when the conversion coefficient B varies due to a change in temperature. Note that, when the conversion coefficient B becomes small due to a rise in temperature, a conversion rate of the difference voltage (Vin−Vref) by the conversion coefficient B becomes small. Thus, the signal propagation speed of the delay cell becomes low, whereby an output signal does not change unless the difference voltage (Vin−Vref) becomes high. That is, when the temperature is high, the output signal does not change unless the input voltage Vin is much higher than the reference voltage Vref. Inversely, in respect to the difference voltage (Vref−Vin) in a case where the input voltage Vin is lower than the reference voltage Vref, an output signal does not change unless the input voltage Vin is a much lower voltage. As a result, when the temperature is high, for example, a range of the input voltage Vin becomes wider, in which range an output signal is "0". However, even when there is a change in temperature, influence of the variation in the signal propagation speed due to the variation in the conversion coefficient B is generated symmetrically with the reference voltage Vref as a center. Thus, a center value of a voltage to be reference of the A/D conversion is fixed to the reference voltage Vref.

In the present embodiment, the first delay cell column 111 and the second delay cell column 121, which are respectively biased by bias currents, are included. The bias currents respectively correspond to the first difference voltage (Vin−Vref) and the second difference voltage (Vref−Vin) which are in a negative-phase relationship. A difference, in propagation speed of the trigger signal trig, between the first delay cell column 111 and the second delay cell column 121, is detected as a difference in delay time between both delay cell columns, and the difference in the delay time is A/D converted. A difference in the delay time of the signal propagation between the first delay cell column 111 and the second delay cell column 121, respectively biased by currents corresponding to the first difference voltage (Vin−Vref) and the second difference voltage (Vref−Vin) which are in a negative-phase relationship, is used. Thus, it is possible to perform A/D conversion in which an output value changes, corresponding to a case where the input voltage Vin is higher than the reference voltage Vref and an inverse case where the input voltage Vin is lower than the reference voltage Vref, with the reference voltage Vref as a center. Even when the signal propagation speed υo of the delay cell changes, for example, due to temperature, a variation in the signal propagation speed υo of the delay cell is canceled by controlling the detection timing of the first delay line circuit 110 and the second delay line circuit 120 with the output from the detection signal generation circuit 20 which includes the delay cells in a configuration similar to that of the delay cells in the first delay cell column 111 and the second delay cell column 121. Thus, it is possible to perform the A/D conversion with a center value serving as a reference which is fixed to the reference voltage Vref. Verification of this effect will be described later.

Figure 2:
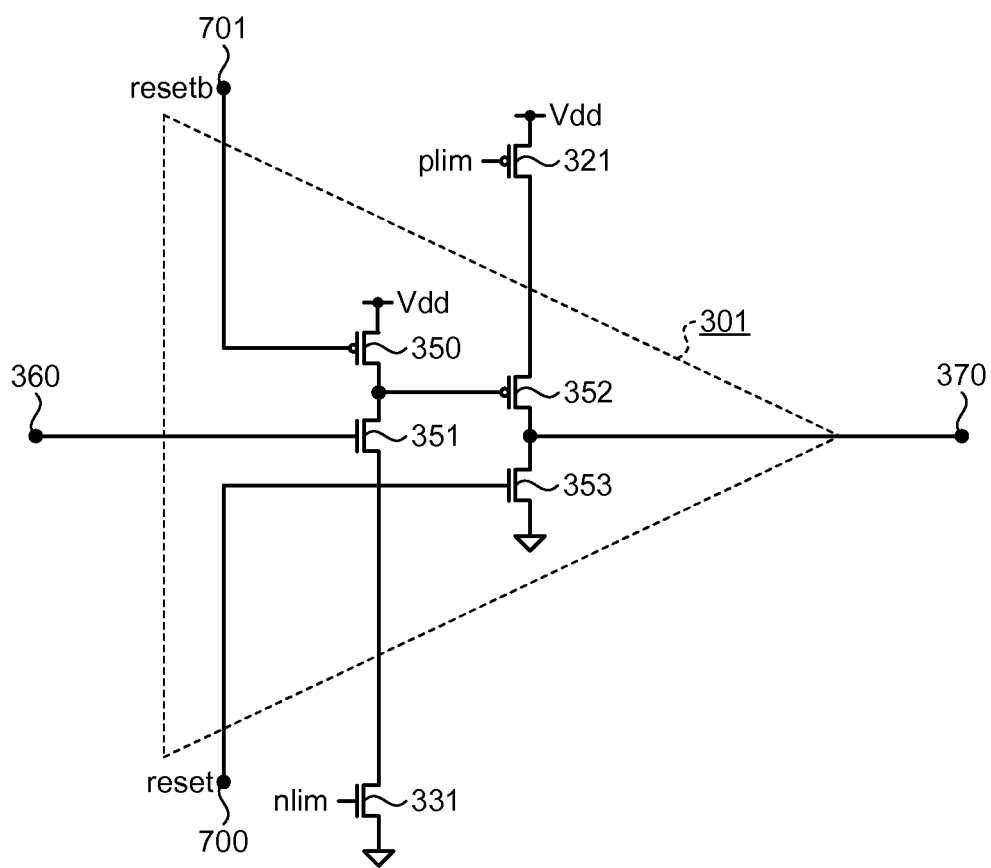
FIG. 2 is a view illustrating a delay cell of an embodiment.

FIG. 2 is a view illustrating a delay cell, which is used for each delay cell column, of an embodiment. As an example, a delay cell 301 in the first delay cell column 111 will be described. The delay cell 301 includes an NMOS transistor 351, a gate electrode of which is connected to an input end 360. A source electrode of the NMOS transistor 351 is connected to a drain electrode of the NMOS transistor 331. As described earlier, the NMOS transistor 331 is in the first transistor group 1110 and supplies a bias current to the delay cell 301. A drain electrode of the NMOS transistor 351 is connected to a drain electrode of a PMOS transistor 350. To a source electrode of the PMOS transistor 350, a power supply voltage Vdd is applied, and to a gate electrode thereof, a reset signal resetb to be supplied to the terminal 701 is applied.

The drain electrode of the PMOS transistor 350 is connected to a gate electrode of a PMOS transistor 352. A source electrode of the PMOS transistor 352 is connected to a drain electrode of the PMOS transistor 321. As described earlier, the PMOS transistor 321 is in the second transistor group 1111 and supplies a bias current to the delay cell 301. A drain electrode of the PMOS transistor 352 is connected to an output terminal 370 and a drain electrode of an NMOS transistor 353. A source electrode of the NMOS transistor 353 is grounded, and to a gate electrode thereof, a reset signal reset to be supplied to the terminal 700 is applied.

The reset signal resetb supplied to the terminal 701 is an inversion signal of the reset signal reset supplied to the terminal 700. When the reset signal reset becomes a High level, the NMOS transistor 353 is turned on and an output is reset. Also, since the reset signal resetb in the terminal 701 becomes a Low level, the PMOS transistor 350 is turned on and potential of the gate electrode of the PMOS transistor 352 is precharged to the power supply voltage Vdd. When an input at the High level is applied to the input end 360, the NMOS transistor 351 is turned on and the potential of the gate electrode of the PMOS transistor 352 is lowered. Thus, the PMOS transistor 352 is turned on and an output becomes the High level. That is, in response to a rise of the input signal applied to the input end 360, an output signal becomes the High level and the input signal is propagated to the output terminal 370.

To the NMOS transistor 351 in a preceding stage, the bias current corresponding to the first difference voltage (Vin−Vref) is supplied by the NMOS transistor 331, and to the PMOS transistor 352 in the following stage, the bias current corresponding to the first difference voltage (Vin−Vref) is supplied by the PMOS transistor 321, the NMOS transistor 351 and the PMOS transistor 352 being included in the delay cell 301. Each of a discharging path, which passes through the NMOS transistor 351 in the preceding stage, and a charging path, which passes through the PMOS transistor 352 in the following stage, is controlled by the bias current corresponding to the first difference voltage (Vin−Vref). Thus, sensitivity of the delay cell 301 to the first difference voltage (Vin−Vref) becomes high.

Figure 3A:
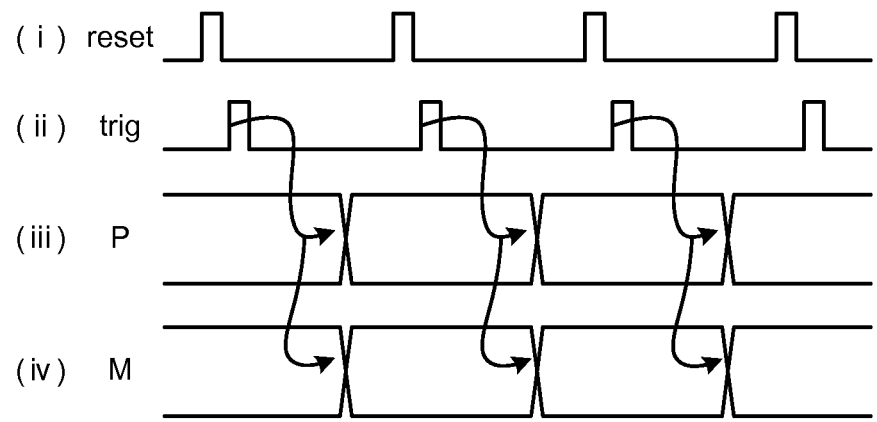
FIG. 3A and FIG. 3B are a view and a chart for describing circuit operation of the A/D converter.
Figure 3B:
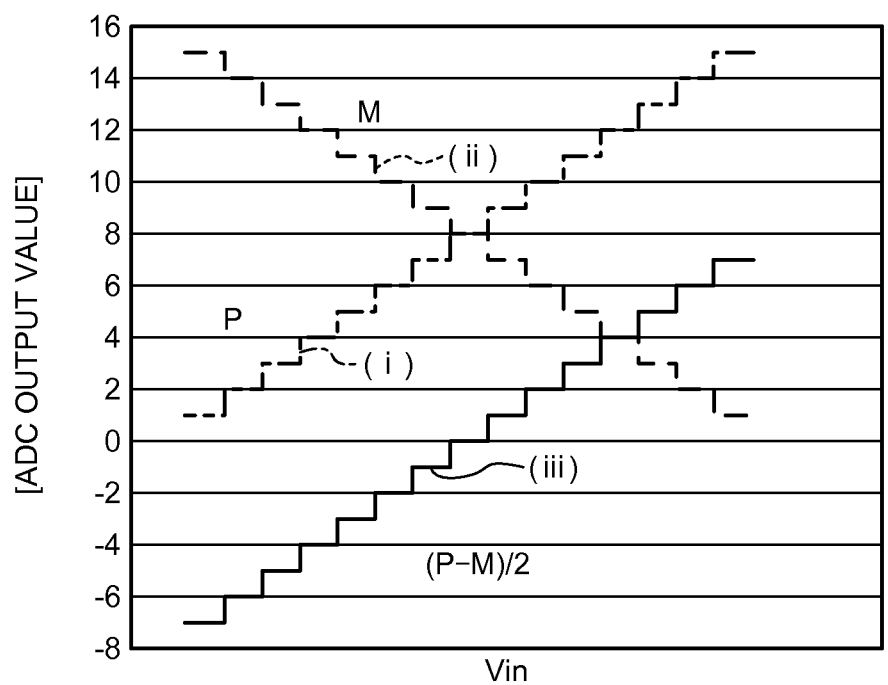

FIG. 3A and FIG. 3B are a view and a chart for describing circuit operation of the A/D converter. FIG. 3A is a view illustrating a relationship in timing between a signal supplied to the A/D converter and an output signal. First, the delay cells in each delay cell column is reset by the reset signal reset ((i) in FIG. 3A). As described earlier, the reset signal resetb which is the inversion signal of the reset signal reset is also supplied, but is not illustrated in the drawing. The trigger signal trig is supplied ((ii) in FIG. 3A). As described earlier, the trigger signal trig is supplied to each of the first delay cells (301, 401, and 501) in the first delay line circuit 110, the second delay line circuit 120, and the detection signal generation circuit 20. The trigger signal trig is delayed in the detection signal generation circuit 20, and is supplied to each of the delay line circuits as the detection signal check, after a predetermined time has passed. In response to the detection signal check, a signal of the delay cell column in each of the delay line circuits is taken into the flip-flop circuit in the corresponding flip-flop circuit column, and an output from each flip-flop circuit column is encoded by the encoder. Thus, the output signals P and M can be obtained ((iii) and (iv) in FIG. 3A).

FIG. 3B is a chart illustrating a relationship among the output signals. In FIG. 3B, a dashed-dotted line (i) indicates the output signal P of the first delay circuit 110. In other words, the output signal P is an output signal corresponding to delay time of the first delay cell column 111, to which a bias current corresponding to the positive-phase difference voltage (Vin−Vref) is supplied. As the input voltage Vin increases, an output increases diagonally to the right. In FIG. 3B, a dashed line (ii) indicates the output signal M of the second delay circuit 120. In other words, the output signal M is an output signal corresponding to delay time of the second delay cell column 121, to which a bias current corresponding to the negative-phase difference voltage (Vref−Vin) is supplied. As the input voltage Vin increases, an output decreases diagonally to the right. In FIG. 3B, a solid line (iii) indicates the digital output signal (P−M)/2 which has ½ of the difference value between the output signal P and the output signal M. As the input voltage Vin increases, an output increases diagonally to the right. The digital output signal (P−M)/2 is output as an output signal of the A/D converter. When the input voltage Vin is equal to the reference voltage Vref, the digital output signal (P−M)/2 is "0".

Figure 4:
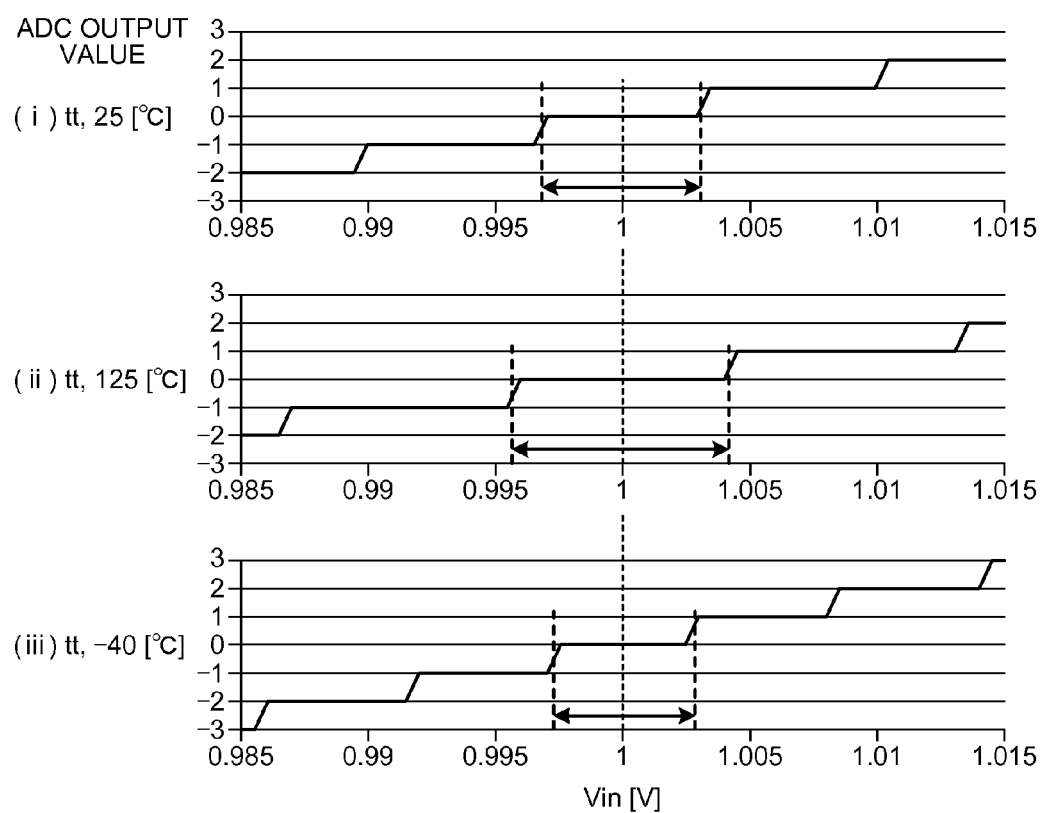
FIG. 4 is a chart illustrating an operation characteristic of the A/D converter.

FIG. 4 is a chart illustrating a simulation result of the output signal of the A/D converter. The simulation verifies how the output signal changes in a case where temperature is changed and delay time of the delay cell varies. In FIG. 4, a result of the verification with the temperature being set at 25° C., 125° C., and −40° C. is illustrated in (i), (ii), and (iii), respectively. In the result, it is found that a range, in which the output signal becomes "0", of the input voltage Vin varies, but a center value thereof does not vary. As described earlier, the conversion coefficient B to the signal propagation speed, which is expressed in the formulas (3) and (4), varies due to a change in temperature and a conversion rate of the difference value (Vin−Vref) between the input voltage Vin and the reference voltage Vref changes. Thus, a value of the input voltage Vin, which is necessary for the output signal to change, changes. Thereby, the range, in which the output signal becomes "0", of the input voltage Vin varies. For example, an output voltage of the power supply circuit is controlled in such a manner that the output voltage is equal to the reference voltage Vref. Thus, it is important that a value of the voltage to be a reference value does not vary. By using the A/D converter of the present embodiment as a control circuit of an output voltage of a power supply circuit, it becomes possible to control the output voltage of the power supply circuit in an environment in which a center voltage to be a reference is fixed to the reference voltage Vref.

Figure 5:
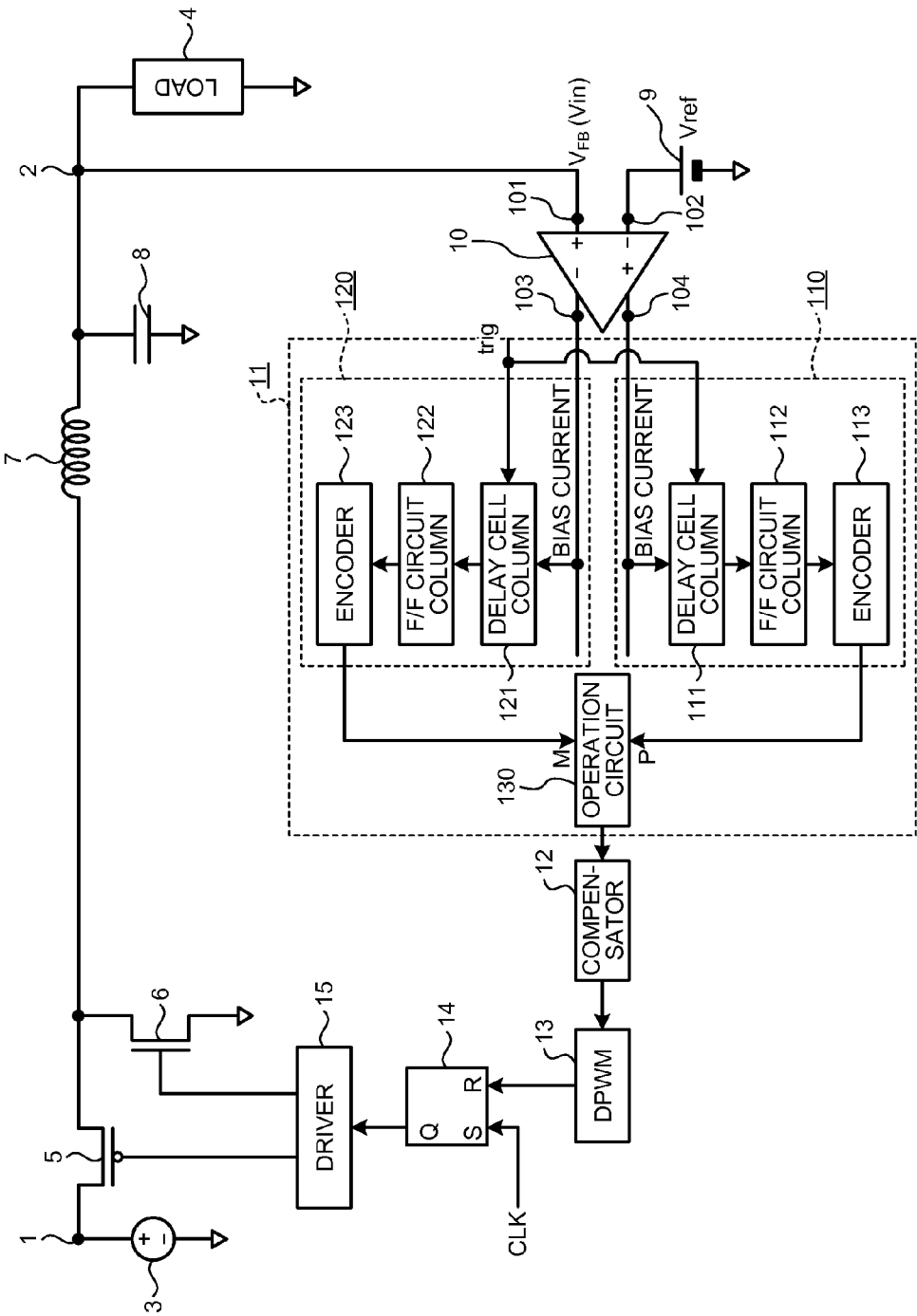
FIG. 5 is a view illustrating a semiconductor integrated circuit of an embodiment, in which the A/D converter is applied as a power supply circuit.

FIG. 5 is a view illustrating a semiconductor integrated circuit, in which the A/D converter of the embodiment already described is applied as a power supply circuit, of an embodiment. To components corresponding to those of the embodiment already described, the same signs are assigned and description thereof is not repeated. To an input terminal 1, a DC power source 3 is connected. The input terminal 1 is connected to one end of an inductor 7 through a PMOS switching transistor 5. The other end of the inductor 7 is connected to an output terminal 2. To the output terminal 2, one end of a capacitor 8 is connected. The other end of the capacitor 8 is grounded. To the output terminal 2, to which an output voltage is supplied, a load 4 is connected.

A feedback voltage $V_{FB}$ of the output voltage is supplied, as an input voltage Vin, to the input terminal 101 of the differential amplifier circuit 10. To the other input terminal 102 of the differential amplifier circuit 10, a reference voltage Vref is applied by a reference voltage source 9. An output from the positive-phase output terminal 104 in the differential amplifier circuit 10 supplies a bias current to the delay cell column 111 in the first delay line circuit 110. A trigger signal trig is supplied to the first delay cell column 111. In response to a detection signal check (not illustrated), the trigger signal trig propagating through the first delay cell column 111 is taken into the first flip-flop circuit column 112. An output signal of the first flip-flop circuit column 112 is encoded by the first encoder 113 and an encoded output signal P is supplied to the operation circuit 130.

Similarly, an output from the negative-phase output terminal 103 in the differential amplifier circuit 10 supplies a bias current to the delay cell column 121 in the second delay line circuit 120. The trigger signal trig is supplied to the second delay cell column 121. In response to the detection signal check (not illustrated), the trigger signal trig propagating through the second delay cell column 121 is taken into the second flip-flop circuit column 122. An output signal of the second flip-flop circuit column 122 is encoded by the second encoder 123 and an encoded output signal M is supplied to the operation circuit 130. In the operation circuit 130, processing for calculating ½ of a difference value between the output signal P and the output signal M is performed, and a digital output signal (P−M)/2 of the A/D converter is output therefrom. The digital output signal (P−M)/2 of the A/D converter is a digital signal corresponding to a difference voltage (Vin−Vref) between the input voltage Vin and the reference voltage Vref. The input voltage Vin is the feedback voltage $V_{FB}$, of the output voltage, being applied as an input.

The digital output signal (P−M)/2 of the A/D converter from the operation circuit 130 is supplied to a digital compensator 12. For example, the digital compensator 12 performs proportional integral derivative (PID) control and generates, from the digital output signal (P−M)/2 of the A/D converter, a control signal to control duty of a PWM signal. Then, the digital compensator 12 supplies the generated signal to a digital PWM circuit 13. An output signal from the digital PWM circuit 13 is supplied to a reset input end R of an RS latch circuit 14. The RS latch circuit 14 is set by a system clock signal CLK, and supplies, to a driver 15, an output Q which is reset by an output from the digital PWM circuit 13. Note that the system clock signal CLK is used as a trigger signal trig of the digital processing circuit 11.

By an output from the driver 15, the PMOS switching transistor 5 and an NMOS switching transistor 6 are driven. When the feedback voltage $V_{FB}$ of the output voltage is lower than the reference voltage Vref, a control to keep the PMOS switching transistor 5 being on for a longer period of time is performed in order to make the output voltage higher.

By the digital processing circuit 11 included in the A/D converter of the embodiment already described, it is possible to perform a control to make the output voltage of the power supply circuit equal to the reference voltage Vref, by a control signal corresponding to the difference voltage (Vin−Vref) between the input voltage Vin and the reference voltage Vref. As described earlier, even when delay time of the delay cell varies due to a change in temperature or the like, a center value serving as a reference is fixed to the reference voltage Vref, and thus, it is possible to perform the control to make the output voltage equal to the reference voltage Vref in a stable condition.

Second Embodiment

Figure 6:
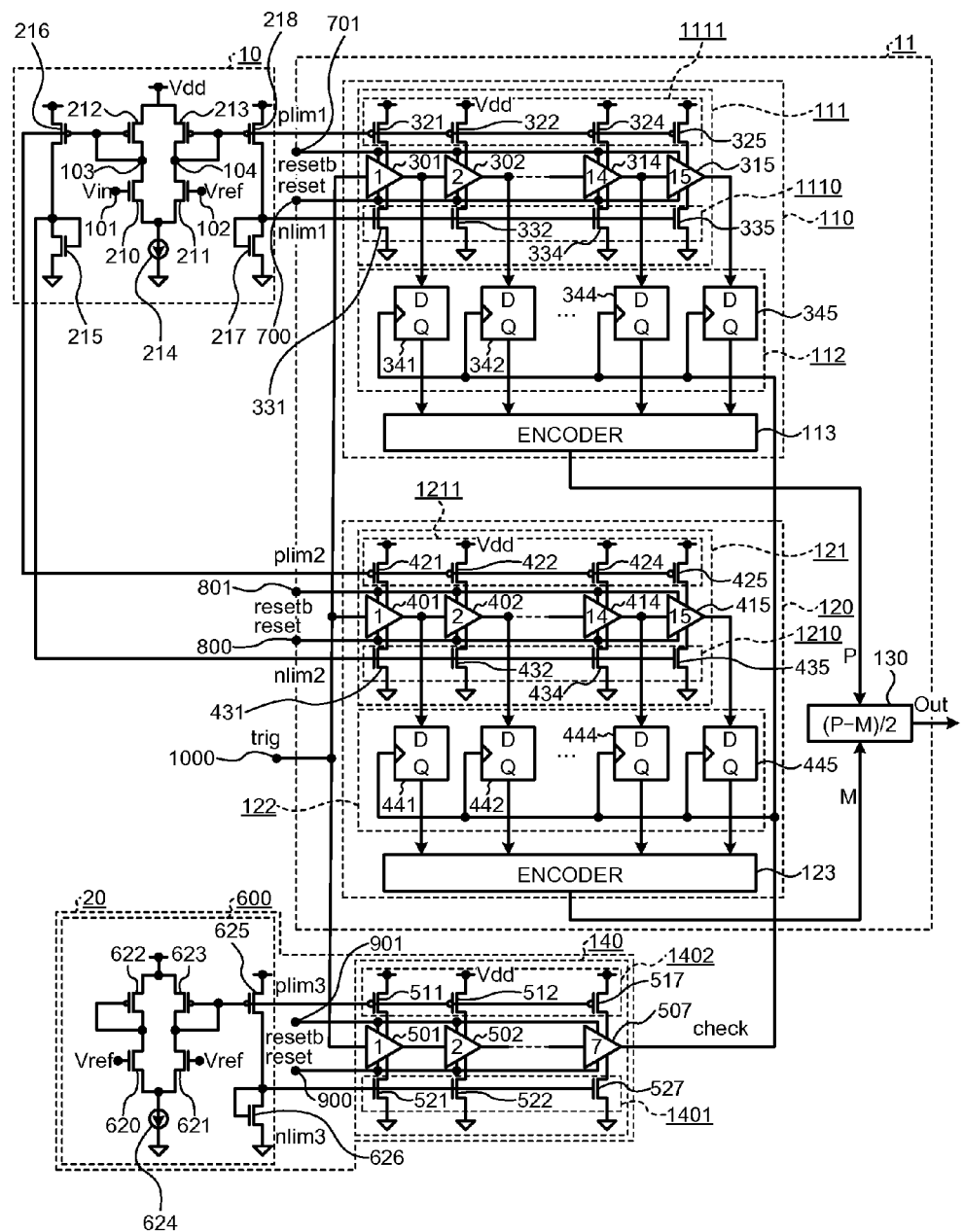
FIG. 6 is a view illustrating an A/D converter of a second embodiment.

FIG. 6 is a view illustrating an A/D converter of a second embodiment. To components corresponding to those of the embodiment already described, the same signs are assigned and description thereof is not repeated. In the present embodiment, a configuration of a first differential amplifier circuit 10 and a second differential amplifier circuit 600 are different from those of the described embodiment. That is, in the first differential amplifier circuit 10, a differential pair to receive an input voltage Vin and a reference voltage Vref is configured by an NMOS transistor 210 and an NMOS transistor 211. A current mirror circuit to supply a bias current to each delay cell in a first delay cell column 111 is configured by a PMOS transistor 213, which is connected on a side of a drain electrode of the NMOS transistor 211, and each PMOS transistor (321, 322, 324, and 325) in a second transistor group 1111. Also, drain electrodes of NMOS transistors (331, 332, 334, and 335) in a first transistor group 1110 supply the bias current to the delay cells in the first delay cell column 111, respectively. Each of the NMOS transistors (331, 332, 334, and 335) in the first transistor group 1110 configures a current mirror circuit with an NMOS transistor 217 which receives a drain current of a PMOS transistor 218. The PMOS transistor 218 configures a current mirror circuit with the PMOS transistor 213.

Similarly, a current mirror circuit to supply a bias current to each delay cell in the second delay cell column 121 is configured by a PMOS transistor 212, which is connected on a side of a drain electrode of the NMOS transistor 210, and each PMOS transistor (421, 422, 424, and 425) in a fourth transistor group 1211. Also, drain electrodes of NMOS transistors (431, 432, 434, and 435) in a third transistor group 1210 supply the bias current to the delay cells in the second delay cell column 121, respectively. Each of the NMOS transistors (431, 432, 434, and 435) in the third transistor group 1210 configures a current mirror circuit with an NMOS transistor 215 which receives a drain current of a PMOS transistor 216. The PMOS transistor 216 configures a current mirror circuit with the PMOS transistor 212.

A differential pair of the second differential amplifier circuit 600 in a detection signal generation circuit 20 is configured by NMOS transistors 620 and 621. A current mirror circuit to supply a bias current to each delay cell in a third delay cell column 140 is configured between a PMOS transistor 623, which is connected on a side of a drain electrode of the NMOS transistor 621, and each PMOS transistor (511, 512, and 517) in a sixth transistor group 1402. Also, drain electrodes of NMOS transistors (521, 522, and 527) in a fifth transistor group 1401 supply the bias current to the delay cells in the third delay cell column 140, respectively. Each of the NMOS transistors (521, 522, and 527) in the fifth transistor group 1401 configures a current mirror circuit with an NMOS transistor 626 which receives a drain current of a PMOS transistor 625. The PMOS transistor 625 configures a current mirror circuit with the PMOS transistor 623.

Also in the present embodiment, outputs respectively corresponding to the first difference voltage (Vin−Vref) and the second difference voltage (Vref−Vin), which are in a negative-phase relationship, are obtained respectively from the positive-phase output terminal 104 and the negative-phase output terminal 103. Then, the outputs are converted into the bias currents and are supplied to the delay cells in the first delay line circuit 110 and the second delay line circuit 120, respectively. The difference value between the output signal P of the first delay line circuit 110 and the output signal M of the second delay line circuit 120 is calculated by using the first difference voltage (Vin−Vref) and the second difference voltage (Vref−Vin) which are in the negative-phase relationship. Thus, as described earlier, an A/D converter which performs A/D conversion, in which a center value serving as a reference does not vary, can be realized.

Third Embodiment

Figure 7:
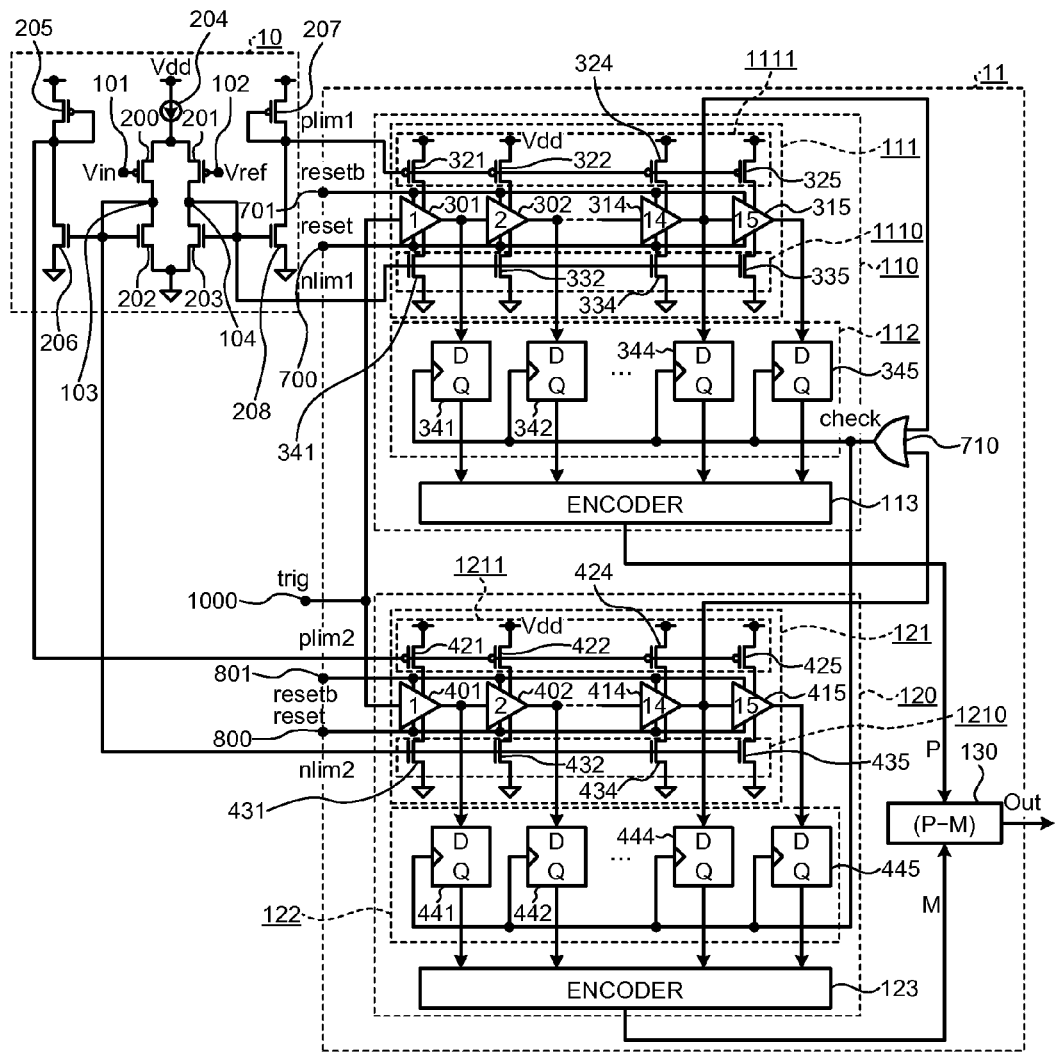
FIG. 7 is a view illustrating an A/D converter of a third embodiment.

FIG. 7 is a view illustrating an A/D converter of a third embodiment. To components corresponding to those of the embodiments already described, the same signs are assigned and description thereof is not repeated. In the present embodiment, a detection signal check to set timing for a flip-flop circuit column to take a signal of a delay cell column is generated by using an output signal from the delay cell column. That is, an output signal of a fourteenth delay cell 314 in a first delay cell column 111 and an output signal of a fourteenth delay cell 414 in a second delay cell column 121 are supplied to an OR circuit 710, and an output signal of the OR circuit 710 is used as a detection signal check. That is, between the output signals from the first delay cell column 111 and the second delay cell column 121, the OR circuit 710 responds to a signal which is input earlier, and outputs the detection signal check. In the present embodiment, the detection signal check is generated by using outputs of the delay cells in the first delay cell column 111 and the second delay cell column 121 which are in the same configuration. Thus, even when signal propagation speed υo varies due to a change in temperature, the variation is canceled between the first delay cell column 111 and the second delay cell column 121 and a center value serving as a reference is fixed to a reference voltage Vref. An operation circuit 130 outputs a difference value (P−M) between an output signal P from the first delay line circuit 110 and an output signal M from the second delay line circuit 120.

Figure 8:
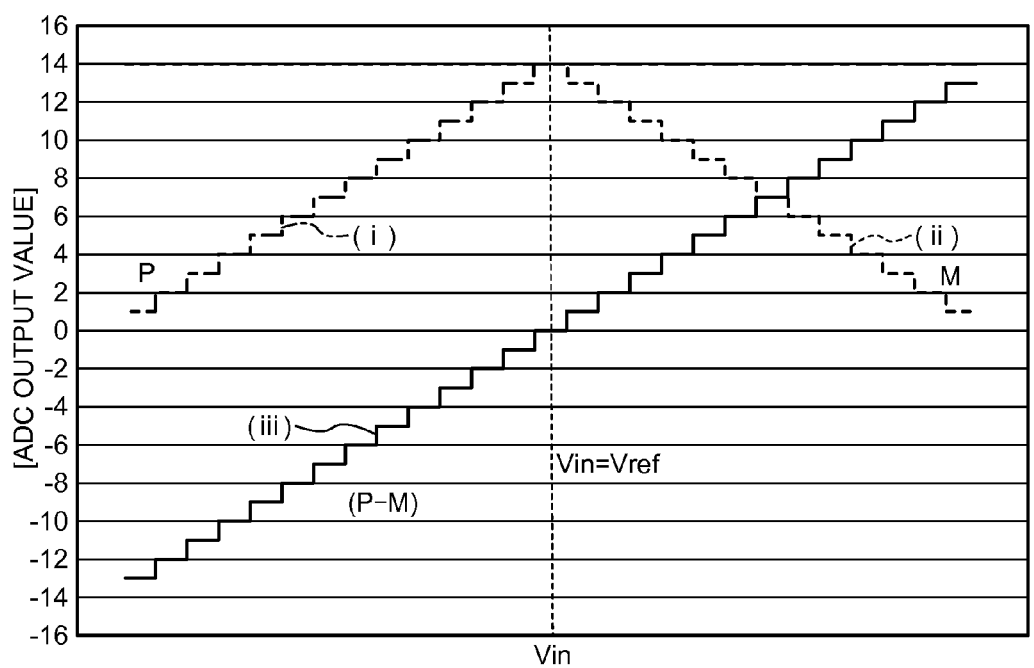
FIG. 8 is a chart illustrating an operation characteristic of the A/D converter of the third embodiment.

FIG. 8 is a view for describing circuit operation of the A/D converter of the third embodiment. A simulation result of the output signal of the A/D converter is illustrated. In FIG. 8, a dashed-dotted line (i) indicates the output signal P of the first delay line circuit 110, a dashed line (ii) indicates the output signal M of the second delay line circuit 120, and a solid line (iii) indicates a digital signal output (P−M). The output signal P of the first delay line circuit 110, which outputs a signal corresponding to a difference voltage (Vin−Vref) between an input voltage Vin and the reference voltage Vref, increases as the input voltage Vin increases. The output signal P shows a constant maximum value when the input voltage Vin becomes higher than the reference voltage Vref. That is, when the input voltage Vin becomes higher than the reference voltage Vref, signal propagation speed of the delay cell in the first delay line circuit 110 becomes higher than signal propagation speed of the delay cell in the second delay line circuit 120. Thus, the output signal from the first delay cell column 111 in the first delay line circuit 110 is input to the OR circuit 710 earlier. Consequently, at timing in which the detection signal check is output from the OR circuit 710, a signal at a High level is output from each of the delay cells in the first delay cell column 111. Thus, the output signal P of the first delay line circuit 110 shows the constant maximum value.

Inversely, in respect to the output signal M of the second delay line circuit 120 which outputs a signal corresponding to the difference voltage (Vref−Vin) between the reference voltage Vref and the input voltage Vin, in a range in which the input voltage Vin is smaller than the reference voltage Vref, the signal propagation speed of the second delay line circuit 120 becomes higher than the signal propagation speed of the delay cell in the first delay line circuit 110. Thus, the output signal from the second delay cell column 121 in the second delay line circuit 120 is input to the OR circuit 710 earlier. Consequently, at timing in which the detection signal check is output from the OR circuit 710, a signal at the High level is output from each of the delay cells in the second delay cell column 121. Thus, the output signal M of the second delay line circuit 120 shows a constant maximum value. When the input voltage Vin becomes higher than the reference voltage Vref, the output signal M decreases as the input voltage Vin increases.

According to the present embodiment, it is possible to compare the difference voltage in a case where the input voltage Vin is higher than the reference voltage Vref and the difference voltage in a case where the input voltage Vin is smaller than the reference voltage Vref, with the reference voltage Vref as a center, by using fourteen delay cells of each of the first delay line circuit 110 and the second delay line circuit 120. That is, comparison, in which the fourteen delay cells on the right and the fourteen delay cells on the left are used symmetrically with a case of Vin=Vref being a center, can be performed. Thus, with the number of delay cells same as the number of cells used to obtain a four-bit output, a five-bit output having twice the resolution can be obtained. Thus, instead of a configuration to calculate ½ of the difference value between the output signal P of the first delay line circuit 110 and the output signal M of the second delay line circuit, a configuration to calculate the difference value (P−M) between the output signal P and the output signal M is included, whereby an A/D converter having high resolution can be realized. Also, in the present embodiment, a detection signal generation circuit is simplified, and thus, power consumption can be reduced. In the present embodiment, the detection signal check is generated by using outputs of the delay cells in the first delay cell column 111 and the second delay cell column 121 which are in the same configuration. Thus, even when signal propagation speed υo varies due to a change in temperature, the variation is canceled between the first delay cell column 111 and the second delay cell column 121 and a center value serving as a reference is fixed to a reference voltage Vref. Note that a delay cell to supply a signal to the OR circuit 710 is not limited to the fourteenth delay cell, and can be selected arbitrarily in consideration of timing for taking data from each of the delay cell columns into the corresponding flip-flop circuit column.

Fourth Embodiment

Figure 9:
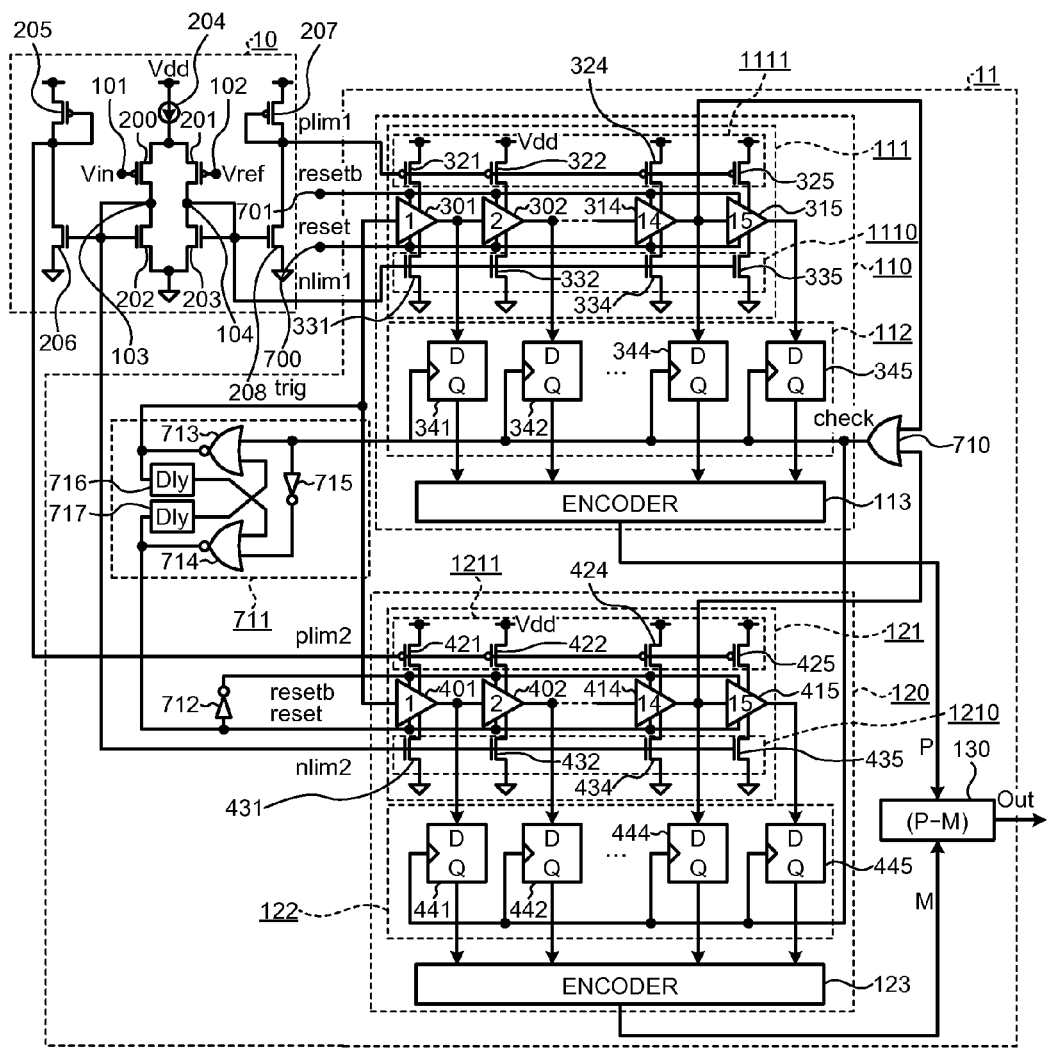
FIG. 9 is a view illustrating an A/D converter of a fourth embodiment.

FIG. 9 is a view illustrating an A/D converter of a fourth embodiment. To components corresponding to those of the embodiments already described, the same signs are assigned and description thereof is not repeated. In the present embodiment, a trigger signal trig, a reset signal reset, and a detection signal check are generated by an A/D converter circuit itself. Also, a timing adjustment circuit 711 to adjust timing of the trigger signal trig and the reset signal reset is included.

The timing adjustment circuit 711 includes an NOR circuit 713 to receive a detection signal check of an OR circuit 710. Also, the detection signal check of the OR circuit 710 is supplied to an NOR circuit 714 through an inverter 715. An output of the NOR circuit 713 is supplied to the other input end of the NOR circuit 714 through a delay circuit 716. An output from the NOR circuit 714 is supplied to the other input end of the NOR circuit 713 through a delay circuit 717. The output from the NOR circuit 713 is supplied, as the trigger signal trig, to delay cells 301 and 401 which are first cells of a first delay cell column 111 and a second delay cell column 121, respectively. The output from the NOR circuit 714 is supplied as a reset signal reset to each delay cell. The reset signal reset is inverted by an inverter 712 and supplied as a reset signal resetb to each of the delay cells. Note that, to a terminal 700 on a side of the first delay cell column, the output of the NOR circuit 714 in the timing adjustment circuit 711 is supplied as the reset signal reset. Also, to a terminal 701, the inverted signal of the output signal of the NOR circuit 714 is supplied as the reset signal resetb.

Figure 10:
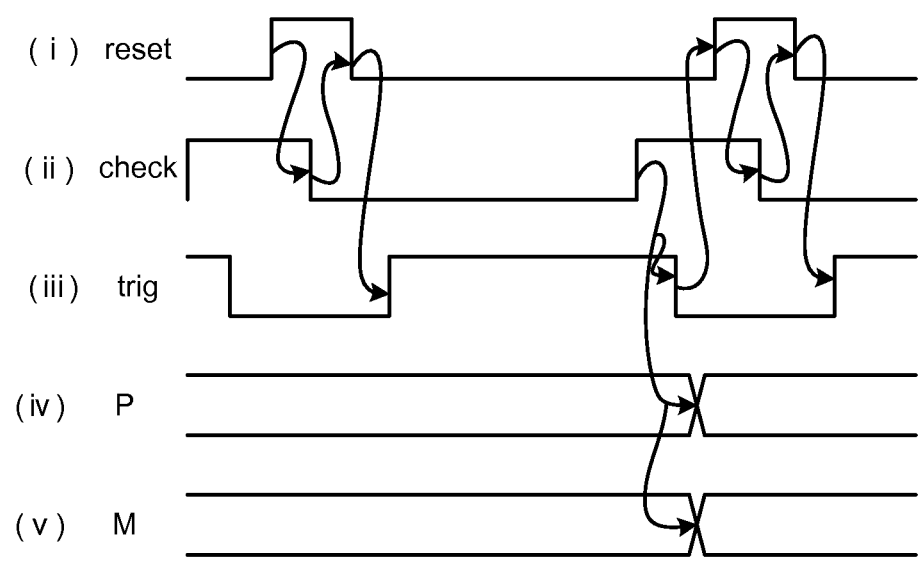
FIG. 10 is a view for describing operation of the fourth embodiment.

FIG. 10 is a view for describing operation of the fourth embodiment. The reset signal reset ((i) in FIG. 10), which is the output from the NOR circuit 714, is delayed by the delay circuit 717 and is input to the NOR circuit 713. When the reset signal reset is input, an output of each of the delay cells becomes a Low level. Thus, the detection signal check output from the OR circuit 710 becomes the Low level. Since the detection signal check ((ii) in FIG. 10) is at the Low level, the NOR circuit 713 responds to a fall of the reset signal reset after a predetermined delay by the delay circuit 717, and the trigger signal trig becomes a High level ((iii) in FIG. 10). In response to a rise of the detection signal check, the trigger signal trig falls. After predetermined delay time by the delay circuit 716, the NOR circuit 714 responds to the fall of the trigger signal trig, and the reset signal reset becomes the High level. In response to the detection signal check, each flip-flop circuit in a first and a second flip-flop circuit columns (112 and 122) takes an output signal of a corresponding delay cell, and an encoded output signal P and an encoded output signal M are output from first and second encoders (113 and 123) ((iv) and (v) in FIG. 10).

Although detailed description is not provided herein, timing adjustment circuit 711 prevents the reset signal reset and the trigger signal trig from becoming the High level simultaneously. Between a power supply voltage Vdd and a ground potential, the delay cell 301, which has been described in an embodiment in FIG. 2, includes serial connection of the PMOS transistor 350 and the NMOS transistor 351. By preventing the trigger signal trig and the reset signal reset, which are input signals supplied to the delay cell 301, from becoming the High level simultaneously, generation of a through-current, which is caused by the PMOS transistor 350 and the NMOS transistor 351 being turned on simultaneously, can be prevented.

According to the present embodiment, a detection signal generation circuit is simplified, and thus, power consumption can be reduced. In the present embodiment, the detection signal check is generated by using outputs of the delay cells in the first delay cell column 111 and the second delay cell column 121 which are in the same configuration. Thus, even when signal propagation speed υo varies due to a change in temperature, the variation is canceled between the first delay cell column 111 and the second delay cell column 121 and a center value serving as a reference is fixed to a reference voltage Vref. Also, since generation timing of the trigger signal trig and the reset signal reset generated by the A/D converter circuit itself is adjusted by the timing adjustment circuit 711, generation of the through-current in the delay cell is prevented.

In the described embodiments, output signals encoded by the encoders are used to calculate a value which is ½ of a difference value between the output signals. However, it is possible to calculate a difference value between output signals of the first and second flip-flop circuit columns first, and to encode a signal which is ½ of the difference value by the encoder.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An A/D converter comprising:
   a first delay cell column in which a plurality of delay cells, to which a first bias current corresponding to a difference voltage between an input voltage and a reference voltage is supplied, is connected in series;
   a second delay cell column in which a plurality of delay cells, to which a second bias current corresponding to a negative-phase voltage of the difference voltage is supplied, is connected in series; and
   an encoder unit configured to encode a difference value, in delay time of signal propagation, between the first delay cell column and the second delay cell column.

2. The A/D converter according to claim 1, wherein the encoder unit is configured to encode a value which is ½ of the difference value, in delay time of signal propagation, between the first delay cell column and the second delay cell column, and is configured to output an encoded value.

3. The A/D converter according to claim 2, further comprising a differential amplifier circuit configured to compare the input voltage and the reference voltage, wherein the first and the second bias currents are generated by using two outputs of the differential amplifier circuit.

4. The A/D converter according to claim 3, further comprising:
   a second differential amplifier circuit including two MOS transistors which configure a differential pair, the reference voltage being supplied as an input to a gate electrode of each of the two transistors which configure the differential pair;

a third delay cell column in which a plurality of delay cells, which has the same configuration as the delay cells in the first delay cell column and the second delay cell column and is fewer than the delay cells in the first delay cell column and the second delay cell column, is connected in series; and a transistor group configured to supply, to each of the delay cells in the third delay cell column, a bias current corresponding to an output voltage of the second differential amplifier circuit, wherein a difference, in delay time of signal propagation, between the first delay cell column and the second delay cell column is detected in response to an output from a delay cell in a final stage of the third delay cell column.

5. The A/D converter according to claim 4, wherein each of the delay cells in the first delay cell column includes:
   a first NMOS transistor which includes a source-drain path, and a gate electrode of which is configured to receive an input signal;
   a second PMOS transistor, a drain electrode of which is connected to a drain electrode of the first NMOS transistor, and to a source electrode of which a power supply voltage is supplied;
   a third PMOS transistor, a gate electrode of which is connected to the drain electrode of the second PMOS transistor, and to a source electrode of which the first bias current is supplied; and
   a fourth NMOS transistor, a drain electrode of which is connected to a drain electrode of the third PMOS transistor, and a source electrode of which is grounded, and
   wherein the first bias current is supplied to a source-drain path of the first NMOS transistor and the second PMOS transistor.

6. The A/D converter according to claim 5, further comprising a logic circuit configured to receive an output signal of each of the first delay cell column and the second delay cell column, wherein a difference, in delay time of signal propagation, between the first delay cell column and the second delay cell column is detected by using an output signal of the logic circuit.

7. The A/D converter according to claim 6, further comprising:
   a first NOR circuit, a first input end of which is configured to receive an output from the logic circuit;
   a second NOR circuit, a first input end of which is configured to receive an inversion signal of the output from the logic circuit;
   a first delay circuit configured to supply an output from the first NOR circuit to a second input end of the second NOR circuit;
   a second delay circuit configured to supply an output from the second NOR circuit to a second input end of the first NOR circuit,
   wherein an output signal of the first NOR circuit is supplied to a first delay cell in each of the first delay cell column and the second delay cell column, and an output signal of the second NOR circuit is used as a reset signal of each of the delay cells in the first delay cell column and the second delay cell column.

8. The A/D converter according to claim 2, further comprising a differential amplifier circuit configured to compare the input voltage and the reference voltage, wherein the first and the second bias currents are generated by using two outputs of the differential amplifier circuit.

9. The A/D converter according to claim 8, further comprising:

a second differential amplifier circuit including two MOS transistors which configure a differential pair, the reference voltage being supplied to a gate electrode of each of the two transistors which configure the differential pair;

a third delay cell column in which a plurality of delay cells, which has the same configuration as the delay cells in the first delay cell column and the second delay cell column and is fewer than the delay cells in the first delay cell column and the second delay cell column, is connected in series; and a transistor group configured to supply, to each of the delay cells in the third delay cell column, a bias current corresponding to an output voltage of the second differential amplifier circuit, wherein a difference, in delay time of signal propagation, between the first delay cell column and the second delay cell column is detected in response to an output from a delay cell in a final stage of the third delay cell column.

10. The A/D converter according to claim 9, wherein each of the delay cells in the first delay cell column includes:
    a first NMOS transistor which includes a source-drain path, and a gate electrode of which is configured to receive an input signal;
    a second PMOS transistor, a drain electrode of which is connected to a drain electrode of the first NMOS transistor, and to a source electrode of which a power supply voltage is supplied;
    a third PMOS transistor, a gate electrode of which is connected to the drain electrode of the second PMOS transistor, and to a source electrode of which the first bias current is supplied; and
    a fourth NMOS transistor, a drain electrode of which is connected to a drain electrode of the third PMOS transistor, and a source electrode of which is grounded, and
    wherein the first bias current is supplied to a source-drain path of the first NMOS transistor and the second PMOS transistor.

11. The A/D converter according to claim 10, further comprising a logic circuit configured to receive an output signal of each of the first delay cell column and the second delay cell column, wherein a difference, in delay time of signal propagation, between the first delay cell column and the second delay cell column is detected by using an output signal of the logic circuit.

12. The A/D converter according to claim 11, further comprising:
    a first NOR circuit, a first input end of which is configured to receive an output from the logic circuit;
    a second NOR circuit, a first input end of which is configured to receive an inversion signal of the output from the logic circuit;
    a first delay circuit configured to supply an output from the first NOR circuit to a second input end of the second NOR circuit;
    a second delay circuit configured to supply an output from the second NOR circuit to a second input end of the first NOR circuit,
    wherein an output signal of the first NOR circuit is supplied to a first delay cell in each of the first delay cell column and the second delay cell column, and an output signal of the second NOR circuit is used as a reset signal of each of the delay cells in the first delay cell column and the second delay cell column.

13. A semiconductor integrated circuit comprising:
    an A/D converter which includes
       a first delay cell column in which a plurality of delay cells, to which a first bias current corresponding to a difference voltage between an input voltage and a reference voltage is supplied, is connected in series, a second delay cell column in which a plurality of delay cells, to which a second bias current corresponding to a negative-phase voltage of the difference voltage is supplied, is connected in series, and an encoder unit configured to encode a difference value, in delay time of signal propagation, between the first delay cell column and the second delay cell column;

a unit configured to supply a feedback voltage of an output voltage of a power supply circuit as the input voltage of the A/D converter; and a unit configured to control the output voltage of the power supply circuit by an output signal of the A/D converter.

14. The semiconductor integrated circuit according to claim 13, further comprising a differential amplifier circuit to which the feedback voltage of the output voltage of the power supply circuit and the reference voltage are supplied, wherein the first bias current is generated corresponding to a first output signal of the differential amplifier circuit and the second bias current is generated corresponding to a second output signal of the differential amplifier circuit.

15. An A/D converter comprising:
a differential amplifier circuit including a first input terminal to which an input voltage is supplied, a second input terminal to which a reference voltage is supplied, a first output terminal configured to output a first output voltage corresponding to a difference voltage between the input voltage and the reference voltage, and a second output terminal configured to output a second output voltage which in a negative-phase of the first output signal;

a first current generation unit configured to generate a first output current corresponding to the first output voltage;

a second current generation unit configured to generate a second output current corresponding to the second output voltage;

a first delay line circuit including a first delay cell column in which a plurality of delay cells, to which the first output current from the first current generation unit is supplied as a bias current, is connected in series, the first delay line circuit being configured to output a first output signal corresponding to delay time of signal propagation in the first delay cell column; and a second delay line circuit including a second delay cell column in which a plurality of delay cells, to which the second output current from the second current generation unit is supplied as a bias current, is connected in series, the second delay cell column including the same number of delay cells as the first delay cell column, and the second delay line circuit being configured to output a second output signal corresponding to delay time of signal propagation in the second delay cell column.

16. The A/D converter according to claim 15, further comprising a unit configured to output a value which is ½ of a difference value between the first output signal of the first delay line circuit and the second output signal of the second delay line circuit.

17. The A/D converter according to claim 16, further comprising:
a first flip-flop circuit column including a plurality of flip-flop circuits, the number of which corresponds to the number of delay cells in the first delay cell column, and each of which is synchronized with a detection signal and takes an output from a corresponding delay cell in the first delay cell column;

a second flip-flop circuit column including a plurality of flip-flop circuits, the number of which corresponds to the number of delay cells in the second delay cell column, and each of which is synchronized with the detection signal and takes an output from a corresponding delay cell in the second delay cell column;

a first encoder configured to encode an output from the first flip-flop circuit column and to output the first output signal; and a second encoder configured to encode an output from the second flip-flop circuit column and to output the second output signal.

18. The A/D converter according to claim 17, wherein each of the delay cells in the first delay cell column includes:
a first NMOS transistor which includes a source-drain path, and a gate electrode of which is configured to receive an input signal; and a second PMOS transistor which includes a source-drain path, and a gate electrode of which is configured to receive an output from the first NMOS transistor, and the first output current is supplied to the source-drain path of each of the first NMOS transistor and the second PMOS transistor.

19. The A/D converter according to claim 18, further comprising:
a second differential amplifier circuit including two MOS transistors which configure a differential pair, the reference voltage being supplied to a gate electrode of each of the two MOS transistors which configure the differential pair;

a third delay cell column in which a plurality of delay cells, which has the same configuration as the delay cells in the first delay cell column and the second delay cell column and is fewer than the delay cells in the first delay cell column and the second delay cell column, is connected in series; and a transistor group configured to supply, to each of the delay cells in the third delay cell column, a bias current corresponding to an output voltage of the second differential amplifier circuit, wherein a difference, in delay time of signal propagation, between the first delay cell column and the second delay cell column is detected in response to an output from a delay cell in a final stage of the third delay cell column.

20. The A/D converter according to claim 19, wherein a trigger signal is supplied simultaneously to a first delay cell in each of the first delay cell column, the second delay cell column and the third delay cell column, and an output signal of the third delay cell column is used as the detection signal.

* * * * *